US010929079B2

(12) United States Patent
Kong

(10) Patent No.: US 10,929,079 B2
(45) Date of Patent: Feb. 23, 2021

(54) VIDEO DISPLAY METHOD, ELECTRONIC DEVICE AND COMPUTER PROGRAM PRODUCT

(71) Applicant: CLOUDMINDS (SHENZHEN) ROBOTICS SYSTEMS CO., LTD., Guangdong (CN)

(72) Inventor: Xiangxiao Kong, Guangdong (CN)

(73) Assignee: CLOUDMINDS (SHENZHEN) ROBOTICS SYSTEMS CO., LTD., Shenzhen (CN)

( * ) Notice: Subject to any disclaimer, the term of this patent is extended or adjusted under 35 U.S.C. 154(b) by 16 days.

(21) Appl. No.: 16/452,873

(22) Filed: Jun. 26, 2019

(65) Prior Publication Data

US 2019/0317716 A1 Oct. 17, 2019

Related U.S. Application Data

(63) Continuation of application No. PCT/CN2016/112497, filed on Dec. 27, 2016.

(51) Int. Cl.
| | |
|---|---|
| *G09G 5/36* | (2006.01) |
| *G06F 9/50* | (2006.01) |
| *G06T 1/60* | (2006.01) |
| *G06F 3/14* | (2006.01) |
| *G06F 9/54* | (2006.01) |
| *G06F 30/30* | (2020.01) |

(52) U.S. Cl.
CPC .............. *G06F 3/14* (2013.01); *G06F 9/5016* (2013.01); *G06F 9/544* (2013.01); *G06F 30/30* (2020.01); *G06T 1/60* (2013.01); *G09G 5/363* (2013.01)

(58) Field of Classification Search
None
See application file for complete search history.

(56) References Cited

U.S. PATENT DOCUMENTS

| | | | |
|---|---|---|---|
| 9,104,544 B1 * | 8/2015 | Uchronski | .......... G06F 9/45558 |
| 2007/0052715 A1 | 3/2007 | Levit-Gurevich | |
| 2009/0172667 A1 | 7/2009 | Wang | |

(Continued)

FOREIGN PATENT DOCUMENTS

| | | |
|---|---|---|
| CN | 101477510 A | 7/2009 |
| CN | 101794237 A | 8/2010 |

(Continued)

OTHER PUBLICATIONS

International Search Report dated Oct. 11, 2017; PCT/CN2016/112497.

(Continued)

*Primary Examiner* — Joni Hsu

(57) ABSTRACT

A video display method includes: allocating a native window to each guest operating system; receiving a request for establishing a physical contiguous memory PCM sub-region corresponding to a new window from the guest operating system; allocating a PCM sub-region to the guest operating system, returning a descriptor of the PCM sub-region to the guest operating system, the descriptor being used for instructing a corresponding hardware codec design to write display data into the PCM sub-region; receiving a display request from the guest operating system; and rendering and displaying the native window corresponding to the guest operating system based on the display request and the data in the PCM sub-region.

15 Claims, 3 Drawing Sheets

(56) References Cited

U.S. PATENT DOCUMENTS

| | | | | |
|---|---|---|---|---|
| 2012/0254896 A1* | 10/2012 | Aloni | ............... | G06F 9/45533 719/319 |
| 2012/0278803 A1* | 11/2012 | Pavlov | ............... | G06F 9/45558 718/1 |
| 2013/0204927 A1* | 8/2013 | Kruglikov | ............... | G06F 9/54 709/203 |
| 2015/0109310 A1 | 4/2015 | Ayanam et al. | | |
| 2015/0193904 A1* | 7/2015 | Vermeulen | ............... | G06F 9/542 345/522 |
| 2017/0358278 A1* | 12/2017 | Lee | ............... | G09G 5/005 |
| 2018/0089881 A1* | 3/2018 | Johnson | ............... | G06F 9/45558 |
| 2018/0109624 A1* | 4/2018 | Jayaraman | ............... | H04W 12/06 |

FOREIGN PATENT DOCUMENTS

| | | |
|---|---|---|
| CN | 105183551 A | 12/2015 |
| CN | 105427236 A | 3/2016 |
| JP | 2006190281 A | 7/2006 |
| JP | 2016220208 A | 12/2016 |

OTHER PUBLICATIONS

1st Office Action dated Mar. 20, 2020 by the CN Office; Appln.No. 201780002591.8.

International Search Report dated Jul. 6, 2018; PCT/CN2017/106577.

Zhou Wei, Research on Virtual Device Model & Implement of Display Optimized in Xen-based Secure Computer. Guangzhou: South China University of Technology, Chinese Master's Theses Full-text Database Information Science and Technology, 2011 (3), I137-10, Mar. 15, 2011.

1st Office Action dated Sep. 8, 2020 by the JP Office; JP 2019-53271.

Hiroaki Kataoka, Advantages of Linus GUI system and Android adoption, FPGA Magazine, No. 5, CQ Publishing Co., Ltd. May 1, 2014, p. 6-15.

* cited by examiner

US 10,929,079 B2

VIDEO DISPLAY METHOD, ELECTRONIC DEVICE AND COMPUTER PROGRAM PRODUCT

CROSS-REFERENCE TO RELATED APPLICATIONS

This application is a continuation of International Application No. PCT/CN2016/112497, with an international filing date of Dec. 27, 2016, the entire contents of which are incorporated herein by reference.

TECHNICAL FIELD

Embodiments of the present application relate to the technical field of virtualization, and in particular, relate to a video display method, and an electronic device and a computer program product thereof.

BACKGROUND

Graphic Memory Allocator (Gralloc) is a management module for a shared memory developed by Google for dedicated use in an Android display system. The shared memory specifically refers to a memory region that features a contiguous physical address and supports a direct memory access (DMA) device. This memory region may be directly accessed by a graphics processing unit (GPU), a visual processing unit (VPU), a camera or the like device, and may also be used as a texture of an open graphics library (OpenGL) for rendering.

By the Gralloc, different modules may share a memory, and the shared memory supports direct access of the DMA device, with no need of copying and processing by a central processing unit (CPU). This greatly reduces a load ratio of the CPU, such that utilization rate and parallel processing capabilities of the CPU are significantly improved.

SUMMARY

An embodiment of the present application provides a video display method. The method includes: allocating a native window to each guest operating system; receiving a request for establishing a physical contiguous memory (PCM) sub-region corresponding to a new window from the guest operating system; allocating a PCM sub-region to the guest operating system, and returning a descriptor of the PCM sub-region to the guest operating system, the descriptor being used for instructing a corresponding hardware codec design to write display data into the PCM sub-region; receiving a display request from the guest operating system; and rendering and displaying the native window corresponding to the guest operating system based on the display request and the data in the PCM sub-region.

Another embodiment of the present application provides an electronic device. The electronic device includes at least one processor; a memory communicably connected to the at least one processor; wherein the memory stores computer-executable instructions that are executable by the at least one processor, wherein the computer-executable instructions, when being executed by the at least one processor, cause the at least one processor to perform the steps of: allocating a native window for each guest operating system; receiving a request for establishing a PCM sub-region corresponding to a new window from the guest operating system; allocating a PCM sub-region to the guest operating system, and returning a descriptor of the PCM sub-region to the guest operating system, the descriptor being used for instructing a corresponding hardware codec design to write display data into the PCM sub-region; receiving a display request from the guest operating system; and rendering and displaying the native window corresponding to the guest operating system based on the display request and the data in the PCM sub-region.

Still another embodiment of the present application provides a computer program product. The computer program product includes a non-transitory computer-readable storage medium storing a computer readable program code, the computer readable program code including instructions that when, being executed by a computer processor, cause the computer processor to perform a method comprising the steps of: allocating a native window to each guest operating system; receiving a request for establishing a PCM sub-region corresponding to a new window from the guest operating system; allocating a PCM sub-region to the guest operating system, and returning a descriptor of the PCM sub-region to the guest operating system, the descriptor being used for instructing a corresponding hardware codec design to write display data into the PCM sub-region; receiving a display request from the guest operating system; and rendering and displaying the native window corresponding to the guest operating system based on the display request and the data in the PCM sub-region.

BRIEF DESCRIPTION OF THE DRAWINGS

Specific embodiments of the present application will now be described with reference to the accompanying drawings, in which.

DETAILED DESCRIPTION

For clearer descriptions of the technical solutions and advantages of the present application, exemplary embodiments of the present application are described in detail hereinafter with reference to the accompanying drawings. Apparently, the described embodiments are merely a part of embodiments of the present application, instead of all the embodiments of the present application. It should be noted that in cases of no conflict, the embodiments and features in the embodiments of the present application may be combined together.

Gralloc may enable different modules to simultaneously access the same memory, and access to the memory also supports a direct access by a DMA device and thus copying by a CPU is not needed. This greatly reduces a load ratio of the CPU, such that utilization rate and parallel processing capabilities of the CPU are significantly improved. However, for virtual operating systems, currently there is no viable solution for virtualizing Gralloc, not to mention a viable solution for displaying videos by using a shared memory.

On this basis, a video display method is provided. The method includes: allocating a native window to each guest operating system in a host operating system; in a guest operating system, requesting a PCM sub-region corresponding to the native window to the host operating system when a shared memory is required in a hardware codec design; in the host operating system, allocating a PCM sub-region for the guest operating system and returning a descriptor of the PCM sub-region; in the guest operating system, allocating the descriptor of the PCM sub-region to a corresponding hardware codec design; sending a display request to the host operating system when a display request sent by hardware codec design is detected; and in the host operating system, based on the data in the PCM sub-region, rendering the native window corresponding to the guest operating system, and displaying the native window.

Figure 1:
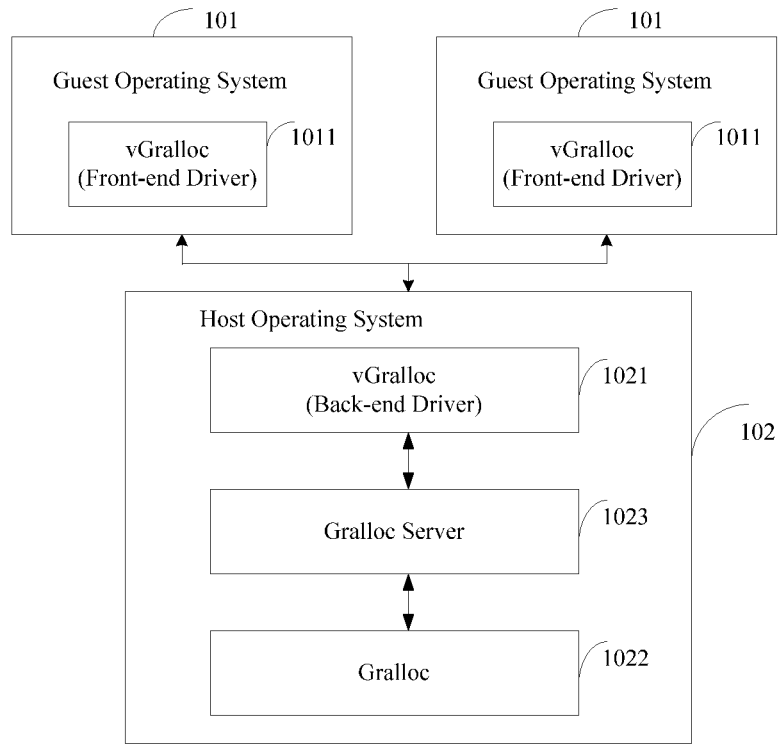
FIG. 1 is a schematic structural diagram of a system employing a video display method according to an embodiment of the present application.

The embodiment of the application provides a video display method, which is applied to a system shown in FIG. 1, the system includes a plurality of guest operating systems 101 and a host operating system 102. Each guest operating system 101 includes a vGralloc and a front-end driver 1011, and the host operating system 102 includes a back-end driver 1021, a Gralloc 1022, and a Gralloc server 1023.

Figure 2:
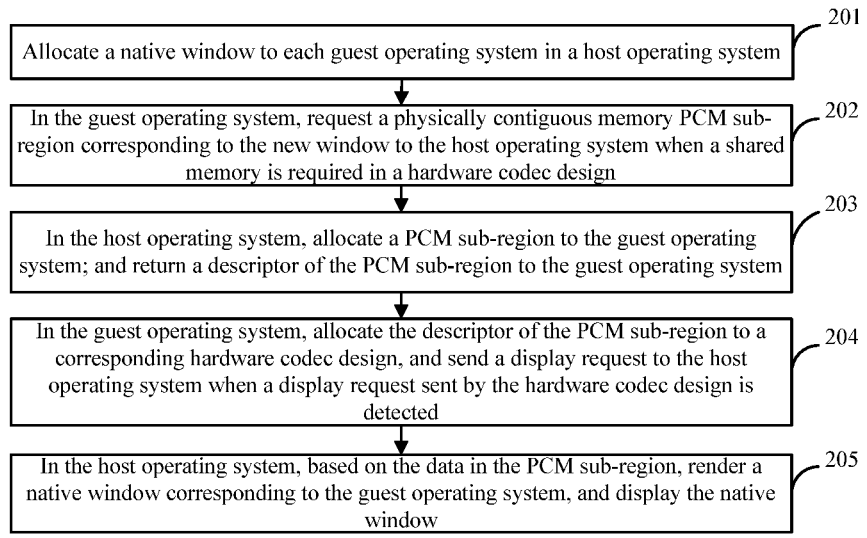
FIG. 2 is a schematic flowchart a video display method according to an embodiment of the present application.

Any guest operating system 101 in the system shown in FIG. 1 can follow the following process when accessing a PCM shared by all guest operating systems 101 and the host operating system 102. Referring to FIG. 2, the process is as follows:

201: In the host operating system, a native window is allocated to each guest operating system.

202: In the guest operating system, when a shared memory is required in a hardware codec design, a request for establishing a PCM sub-region corresponding to a new window is sent to the host operating system; and the hardware codec design includes a video codec and/or a camera.

Specifically, in the guest operating system, a share memory request is sent to the host operating system. For example, any guest operating system 101 requests a PCM sub-region to the Gralloc server 1023 through communication between the front-end driver 1011 and the back-end driver 1021 included therein;

203: In the host operating system, a PCM sub-region is allocated to the guest operating system, and a descriptor of the PCM sub-region is returned to the guest operating system.

The descriptor is used for instructing the corresponding hardware codec design to write display data into the PCM sub-region.

Specifically, in the host operating system, a shared memory sub-region is allocated to the guest operating system by using the Gralloc. For example, the host operating system 102 requests the Gralloc server 1023 to call the Gralloc 1022 to allocate a PCM sub-region to any of the guest operating systems 1021. The host operating system 102 returns a descriptor of the PCM sub-region to the guest operating system through communication between the front-end driver 1011 and the back-end driver 1021.

After the PCM sub-region is allocated to any of the guest operating systems 101 by steps 201 to 203, virtualization of the Gralloc 1022 is achieved.

204: In the guest operating system, the descriptor of the PCM sub-region is allocated to the corresponding hardware codec design, and when a display request sent by the hardware codec design is detected, the display request is sent to the host operating system.

When this step is specifically performed, the memory descriptor can also be transmitted to the host operating system in the guest operating system when the display request sent by the hardware codec design is detected.

In addition, when step 203 is specifically performed, the data of the PCM sub-region can be converted into a texture in the guest operating system when the display request sent by the hardware codec design is detected.

205: In the host operating system, based on the data in the PCM sub-region, the native window corresponding to the guest operating system is rendered, and the native window is displayed.

When this step is specifically performed, the PCM sub-region can be found based on the memory descriptor transmitted by the guest operating system; and the native window corresponding to the guest operating system is rendered based on the data in the PCM sub-region.

When this step is specifically performed, the native window corresponding to the guest operating system can be rendered based on the texture in the PCM sub-region.

Figure 3:
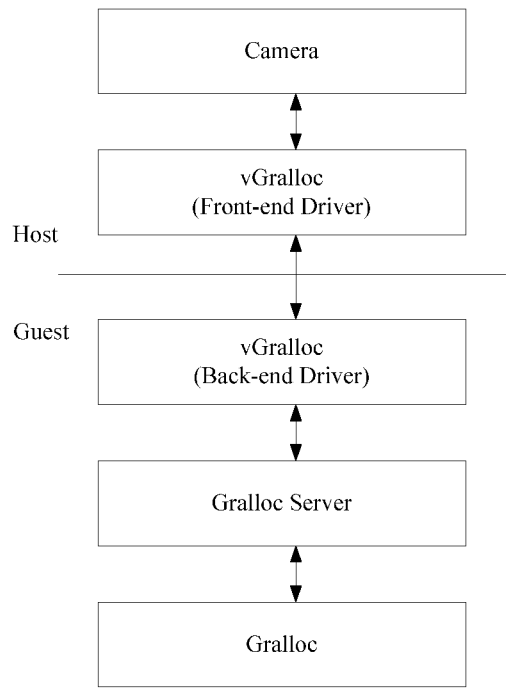
FIG. 3 is a schematic flowchart of another video display method according to an embodiment of the present application.

For example, in the Camera Preview scenario shown in FIG. 3, any one of the guest operating systems 101 is Guest, and host operating system 102 is Host. The Guest requests a PCM sub-region by using the Gralloc server of the Host through communication between the front-end driver of the Guest and the back-end driver of the Host. The Host sends a descriptor of the PCM sub-region to the Guest. The Guest sends the descriptor to a camera, which writes preview data to the PCM sub-region based on the descriptor. The Guest sends the descriptor to a display, and the display reads the data written by the camera from the PCM sub-region based on the descriptor, and renders and displays the data.

The video display method provided by the embodiment of the application may also support the YUV video format, so that application scenarios such as video playing, camera preview and the like can be supported. The display frame rate and switching speed of each Guest can be obviously improved, and the multimedia capability of product is greatly improved by supporting application scenarios such as video playing and camera preview, so that a better interactive experience is brought to users.

For example, a video display process is as follows:

1) A Guest request a Window to display a video and correspondingly requests a PCM sub-region, and transmits a descriptor of the PCM sub-region back to the Guest.

2) The Guest transmits the descriptor of the PCM sub-region to a hardware decoder, the hardware decoder finds the address of the PCM sub-region and directly writes the decoded data into the PCM sub-region through DMA (the CPU does not need to participate in the whole process, and thus a large number of resources of the CPU are saved), and the data in the PCM sub-region is directly converted into a texture by using an extended texture interface of OpenGL after one frame is written.

3) When more than one window is overlaid and rendered for display, the Host overlays and renders all frames of data in the video corresponding to each Window into the Native Window corresponding to the Guest and when a Native Window is set as the topmost layer, a display system at the Host displays the Native Window.

As such, a video display is completed.

Apparently, in the video display method provided by the embodiment, with the support for the memory with continuous physical addresses and sharing thereof enabled, the complexity of moving the data by the CPU is spared, the data copying speed is improved, and meanwhile, the support for directly rendering the YUV data saves overhead for format conversion and copying, and the display effect of video playing is greatly improved.

In addition, the support of rendering the YUV format is added to the display system of the Guest end, and the data of the physical memory is directly used as one texture to render and display. Therefore, unnecessary rendering can be avoided, and the display efficiency is improved.

The advantages are as follows:

In the embodiment of the application, a native window is allocated to each guest operating system in the host operating system; in the guest operating system, when a shared memory is required in a hardware codec design, a request for a corresponding PCM sub-region is sent to the host operating system; in the host operating system, a PCM sub-region is allocated to the guest operating system and a descriptor of the PCM sub-region is returned; in the guest operating system, a descriptor of the PCM sub-region is allocated to the corresponding hardware codec design; when a display request sent by the hardware codec design is detected, a display request is sent to the host operating system; in the host operating system, based on the data in the PCM sub-region, a native window corresponding to the guest operating system is rendered and displayed, so that the video is displayed by using the shared memory.

On the basis of the same inventive concept, an embodiment also provides a video display apparatus which solves the problem in a principle similar to the video display method shown in FIG. 2. Therefore, the implementation of the video display apparatus can be referenced to the implementation of the video display method shown in FIG. 2, and repeated description thereof is not given herein any further.

Figure 4:
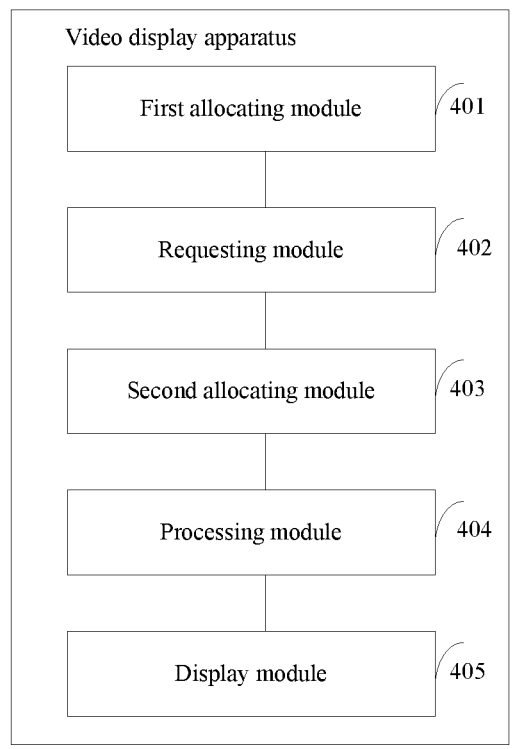
FIG. 4 is a schematic structural diagram of a video display apparatus according to an embodiment of the present application.

Referring to FIG. 4, the video display apparatus includes:

a first allocating module 401, configured to allocating a native window to each guest operating system in the host operating system;

an requesting module 402, configured to request a PCM sub-region corresponding to the new window to the host operating system when a shared memory is required in a hardware codec design in the guest operating system;

a second allocating module 403, configured to allocate the PCM sub-region to a guest operating system in the host operating system, and return a descriptor of the PCM sub-region to the guest operating system; the descriptor being used for instructing the corresponding hardware codec design to write display data into the PCM sub-region;

a processing module 404, configured to allocate allocating the descriptor of the PCM sub-region to a corresponding hardware codec design in the guest operating system, and send a display request to the host operating system when the display request sent by a hardware codec design is detected; and a display module 405, configured to render a native window corresponding to the guest operating system in the host operating system based on the data in the PCM sub-region and displaying the native window.

Optionally, the requesting module 402 is configured to send a memory share request to the host operating system in the guest operating system; and the second allocating module 403 is configured to allocate a PCM sub-region to the guest operating system by using the shared memory management module Gralloc in the host operating system.

Optionally, the apparatus further includes:

a transmitting module, configured to transmit a memory descriptor to the host operating system in the guest operating system when a display request sent by the hardware codec design is detected; and a display module 405, configured to determine a PCM sub-region based on the memory descriptor transmitted by the guest operating system, and render a native window corresponding to the guest operating system based on data in the determined PCM sub-region.

Optionally, the apparatus further includes:

a converting module, configured to convert data of the PCM sub-region into a texture in the guest operating system when a display request sent by a hardware codec design is detected; and a display module 405, configured to render a native window corresponding to the guest operating system based on the texture in the PCM sub-region.

Optionally, the hardware codec design includes a video codec and/or a camera.

The advantages are as follows:

In the embodiment of the application, a native window is allocated to each guest operating system in the host operating system; in the guest operating system, when a shared memory is required in a hardware codec design, a request for a corresponding PCM sub-region is sent to the host operating system; in the host operating system, the PCM sub-region is allocated to the guest operating system and a descriptor of the PCM sub-region is returned; in the guest operating system, the descriptor of the PCM sub-region is allocated to the corresponding hardware codec design; when a display request sent by the hardware codec design is detected, a display request is sent to the host operating system; in the host operating system, based on the data in the PCM sub-region, the native window corresponding to the guest operating system is rendered and displayed, so that the video is displayed by using the shared memory.

Figure 5:
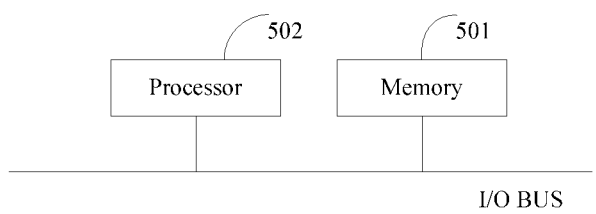
FIG. 5 is a schematic structural diagram of an electronic device according to an embodiment of the present application.

In another aspect, an embodiment of the present application provides an electronic device. Referring to FIG. 5, the electronic device includes:

a memory 501, and at least one processor 502; wherein the memory is connected to the processor through a communication bus; and the processor is configured to execute instructions in the memory; and the memory stores therein instructions for performing the steps of the video display method as described above.

In yet another aspect, an embodiment of the present application provides a computer program product for use with the electronic device, the computer program product including a computer program embedded in a computer-readable storage medium, the computer program including instructions for causing the electronic device to perform the steps of the video display method as described above.

Those skilled in the art shall understand that the embodiments of the present application may be described as illustrating methods, systems, or computer program products. Therefore, hardware embodiments, software embodiments, or hardware-plus-software embodiments may be used to illustrate the present application. In addition, the present application may further employ a computer program product which may be implemented by at least one non-transitory computer-readable storage medium with an executable program code stored thereon. The non-transitory computer-readable storage medium includes, but not limited to, a disk memory, a CD-ROM, and an optical memory.

The present application is described based on the flowcharts and/or block diagrams of the method, device (system), and computer program product. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored in a computer-readable memory capable of causing a computer or other programmable data processing devices to work in a specific mode, such that the instructions stored on the non-transitory computer-readable memory implement a product including an instruction apparatus, wherein the instruction apparatus implements specific functions in at least one process in the flowcharts and/or at least one block in the block diagrams.

These computer program instructions may also be loaded on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

Although the preferred embodiments of the present application are described above, once knowing the basic creative concept, a person skilled in the art can make other modifications and variations to these embodiments. Therefore, the appended claims are intended to be construed as covering the preferred embodiments and all the modifications and variations falling within the scope of the present application.

What is claimed is:

1. A video display method, comprising:
    allocating a native window to each guest operating system; each quest operating system includes a vGralloc and a front-end driver, and the host operating system includes a back-end driver, a Gralloc, and a Gralloc server;
    receiving a request for establishing a physical contiguous memory (PCM) sub-region corresponding to a new window from the guest operating system to the Gralloc server through communication between the front-end driver and the back-end driver included therein;
    allocating a PCM sub-region to the guest operating system;
    returning a descriptor of the PCM sub-region to the quest operating system through communication between the front-end driver and the back-end driver, the descriptor being used for instructing a corresponding hardware codec design to write display data into the PCM sub-region;
    receiving a display request from the guest operating system; and
    rendering and displaying the native window corresponding to the guest operating system, wherein the rendering and displaying are based on the display request and the data in the PCM sub-region.

2. The method according to claim 1, wherein the receiving a request for establishing a physical contiguous memory (PCM) sub-region corresponding to a new window from the guest operating system comprises:
    receiving a request for sharing a memory from the guest operating system; and
    the allocating a PCM sub-region to the guest operating system comprises:
    allocating a PCM sub-region to the guest operating system by using a shared memory management module Gralloc.

3. The method according to claim 1, wherein the display request comprises a memory indicator sent from the guest operating system when a display request sent by the hardware codec design is detected; and
    the rendering and displaying the native window corresponding to the guest operating system comprises:
    identifying the PCM sub-region based on the memory indicator sent by the guest operating system, and rendering and displaying the native window based on the data in the PCM sub-region.

4. The method according to claim 1, wherein the display request comprises a texture converted from the data in the PCM sub-region; and
    the rendering and displaying the native window corresponding to the guest operating system comprises:
    rendering the native window corresponding to the guest operating system based on the texture.

5. The method according to claim 1, wherein the hardware codec design comprises a video codec and/or a camera.

6. An electronic device, comprising:
    at least one processor;
    a memory communicably connected to the at least one processor; wherein the memory stores computer-executable instructions that are executable by the at least one processor, wherein the computer-executable instructions, when being executed by the at least one processor, cause the at least one processor to perform the steps of:
    allocating a native window to each guest operating system; each quest operating system includes a vGralloc and a front-end driver, and the host operating system includes a back-end driver, a Gralloc, and a Gralloc server;
    receiving a request for establishing a physical contiguous memory (PCM) sub-region corresponding to a new window from the guest operating system to the Gralloc server through communication between the front-end driver and the back-end driver included therein;
    allocating a PCM sub-region to the guest operating system, and returning a descriptor of the PCM sub-region to the quest operating system through communication between the front-end driver and the back-end driver, the descriptor being used for instructing a corresponding hardware codec design to write display data into the PCM sub-region;
    receiving a display request from the guest operating system; and
    rendering and displaying the native window corresponding to the guest operating system, wherein the rendering and displaying are based on the display request and the data in the PCM sub-region.

7. The electronic device according to claim 6, wherein the receiving a request for establishing a physical contiguous memory (PCM) sub-region corresponding to a new window from the guest operating system comprises:
    receiving a request for sharing a memory from the guest operating system; and
    the allocating a PCM sub-region to the guest operating system comprises:

allocating a PCM sub-region to the guest operating system by using a shared memory management module Gralloc.

8. The electronic device according to claim 6, wherein the display request comprises a memory indicator sent from the guest operating system when a display request sent by the hardware codec design is detected; and
the rendering and displaying the native window corresponding to the guest operating system comprises:
identifying the PCM sub-region based on the memory indicator sent by the guest operating system, and rendering and displaying the native window based on the data in the PCM sub-region.

9. The electronic device according to claim 6, wherein the display request comprises a texture converted from the data in the PCM sub-region; and
the rendering and displaying the native window corresponding to the guest operating system comprises:
rendering the native window corresponding to the guest operating system based on the texture.

10. The electronic device according to claim 6, wherein the hardware codec design comprises a video codec and/or a camera.

11. A computer program product, wherein the computer program product comprises non-transitory computer-readable storage medium storing a computer readable program code, the computer readable program code comprising instructions that when executed by a computer processor implements a method comprising:
allocating a native window to each guest operating system; each quest operating system includes a vGralloc and a front-end driver, and the host operating system includes a back-end driver, a Gralloc, and a Gralloc server;
receiving a request for establishing a physical contiguous memory (PCM) sub-region corresponding to a new window from the guest operating system to the Gralloc server through communication between the front-end driver and the back-end driver included therein;
allocating a PCM sub-region to the guest operating system;
returning a descriptor of the PCM sub-region to the quest operating system through communication between the front-end driver and the back-end driver, the descriptor being used for instructing a corresponding hardware codec design to write display data into the PCM sub-region;
receiving a display request from the guest operating system; and
rendering and displaying the native window corresponding to the guest operating system, wherein the rendering and displaying are based on the display request and the data in the PCM sub-region.

12. The computer program product according to claim 11, wherein the receiving a request for establishing a physical contiguous memory (PCM) sub-region corresponding to a new window from the guest operating system comprises:
receiving a request for sharing a memory from the guest operating system; and
allocating a PCM sub-region to the guest operating system comprises:
allocating a PCM sub-region to the guest operating system by using a shared memory management module Gralloc.

13. The computer program product according to claim 11, wherein the display request comprises a memory indicator sent from the guest operating system when a display request sent by the hardware codec design is detected; and
the rendering and displaying the native window corresponding to the guest operating system comprises:
identifying the PCM sub-region based on the memory indicator sent by the guest operating system, and rendering and displaying the native window based on the data in the PCM sub-region.

14. The computer program product according to claim 11, wherein the display request comprises a texture converted from the data in the PCM sub-region; and
the rendering and displaying the native window corresponding to the guest operating system comprises:
rendering the native window corresponding to the guest operating system based on the texture.

15. The computer program product according to claim 11, wherein the hardware codec design comprises a video codec and/or a camera.

* * * * *